(12) United States Patent
Yeh

(10) Patent No.: US 6,530,048 B1
(45) Date of Patent: Mar. 4, 2003

(54) I²C TEST SINGLE CHIP

(75) Inventor: Chih-Ping Yeh, Jungli (TW)

(73) Assignee: Delta Electronics Inc., Taoyuan Shien (TW)

(*) Notice: Subject to any disclaimer, the term of this patent is extended or adjusted under 35 U.S.C. 154(b) by 0 days.

(21) Appl. No.: 09/476,229

(22) Filed: Dec. 30, 1999

(30) Foreign Application Priority Data

Aug. 24, 1999 (TW) ...................................... 88214421 U

(51) Int. Cl.⁷ .............................................. G01R 31/28
(52) U.S. Cl. ..................................................... 714/724
(58) Field of Search .................... 714/724; 702/120–121

(56) References Cited

U.S. PATENT DOCUMENTS 6,131,133 A * 10/2000 Salbaum et al. ............... 710/48
6,134,665 A * 10/2000 Klein et al. .................. 713/200
6,286,073 B1 * 9/2001 Vegter ......................... 710/129

FOREIGN PATENT DOCUMENTS

CN          1290875      *  4/2001   .......... G05B/23/02

* cited by examiner

Primary Examiner—Albert Decady
Assistant Examiner—Shelly A Chase
(74) Attorney, Agent, or Firm—William J. Sapone; Coleman Sudol Sapone, P.C.

(57) ABSTRACT

An I²C test single chip for testing an I²C interface of an electronic device is disclosed. The I²C test single chip is electrically connected to a test-environment-providing system outputting a test signal to the electronic device and outputting a second signal to the I²C test single chip simultaneously. The I²C test single chip includes a first interface, a second interface, and a chip body. The first interface, which is also an I²C interface, is electrically connected to the I²C interface of the electronic device for receiving a first signal from the I²C interface of the electronic device in response to the test signal. The second interface is electrically connected to the test-environment-providing system for receiving the second signal. The chip body is used for taking a processing procedure to assist the test-environment-providing system to test the I²C interface of the electronic device in response to the first signal and the second signal.

20 Claims, 5 Drawing Sheets

I²C TEST SINGLE CHIP

FIELD OF THE INVENTION

The present invention relates to an I²C test single chip for testing an electronic device having an I²C interface.

BACKGROUND OF THE INVENTION

With the development of high technology, more and more new electronic devices are developed to facilitate our daily life. In order to increase their efficiency and performance, the electronic devices must be organized together and communicable with each other so that different kinds of communication interfaces are developed, such as universal serial bus (USB), inter-integrated circuit bus (I²C), small computer system interface (SCSI), etc.

The I²C bus is a slave-master communication system and is especially suitable for transmitting data from one device to another at a short distance (smaller than 1.5 m). The I²C bus is composed of a serial data line (SDA), a serial clock line (SCL), and a ground line (GND). The electronic devices on the I²C bus are electrically connected to each other by the SDA (11) and the SCL (12), as shown in FIG. 1. In every communication, one device is the master controlling the communication process and one corresponding device is the slave controlled by the master. Simultaneously, one of the aforementioned devices will also be a transmitter for transmitting data and the other is a receiver for receiving data. As shown in FIG. 1, there is a master-receiver device (13) for controlling the slave-transmitter device (14) to send out data so that the master-receiver device (13) can receive data from the slave-transmitter device (14).

After an electronic device is assembled, all parts of the electronic device need to be tested for obtaining high-quality control. The methods for testing an electronic device with or without an I²C interface are very different. For an electronic device (21) without an I²C interface, the electronic device (21) is only connected to a test system (22) which is used for providing an AC current and various kinds of I/O test signals, such as an overload signal, a short-circuit signal, or an overheat signal, as shown in FIG. 2. For an electronic device (21) with an I²C interface, the electronic device (21) is connected to an AC source (31), an electronic load (32), and an I²C test machine (33) respectively, as shown in FIG. 3. The AC source (31) is used for providing an AC current for the electronic device (21), the electronic load (32) is used for providing I/O test signals, such as short-circuit signal and overload signal, and the I²C test machine (33) is used for testing the I²C interface of the electronic device (21). The I²C test machine (33) is usually a computer having an I²C interface and a test program written by C language for processing the I²C test procedures.

To write an I²C test program needs to combine the knowledge of interface control, control commands, program language, the functional requirements of the electronic device, and related software and hardware. Therefore, it is very difficult to write a good test program. Even though a test program is written, it is very hard to maintain such a complicated program. Consequently, using a test machine or computer to test the I²C interface is very inconvenient.

It is therefore attempted by the applicant to deal with the above situation encountered with the prior art.

SUMMARY OF THE INVENTION

An object of the present invention is to provide an I²C test single chip for testing the I²C interface of an electronic device.

The I²C test single chip is electrically connected to a test-environment-providing system and the electronic device. The test-environment-providing system is used for outputting a test signal to an electronic device having an I²C interface and outputting a second signal to said I²C test single chip simultaneously.

The I²C test single chip includes a first interface, a second interface and a chip body. The first interface is also an I²C interface and is electrically connected to the I²C interface of the electronic device for receiving a first signal from the I²C interface of the electronic device in response to the test signal. The second interface is electrically connected to the test-environment-providing system for receiving the second signal. The chip body is used for taking a processing procedure to assist the test-environment-providing system in testing the electronic device in response to the first signal and the second signal.

According to the present invention, the chip body includes a memory unit, a control unit, and a responding unit. The memory unit is used for recording a corresponding rule between the first signal and the second signal when the I²C interface of the electronic device is well-functioned. The control unit is electrically connected to the memory unit for finishing the processing procedure according to the corresponding rule. The responding unit is electrically connected to the control unit for taking a responding procedure after the control unit finishes the processing procedure.

Preferably, the control unit is a comparator or a microprocessor.

In accordance with the present invention, the processing procedure is to compare a received relationship between the first and the second signals with the corresponding rule to check whether the received relationship between the first and the second signals is correct and to output a test result to the responding unit.

According to the present invention, if the responding unit is a displaying device, such as a liquid crystal display (LCD) monitor, the responding procedure is to display the test result on the displaying device.

According to the present invention, if the responding unit is a responding circuitry, the responding procedure is to output the test result back to the test system.

Preferably, the memory unit is a read-only-memory (ROM).

Preferably, the electronic device is a server power supply.

The present invention may best be understood through the following description with reference to the accompanying drawings, in which:

DETAILED DESCRIPTION OF THE PREFERRED EMBODIMENTS

Figure 1:
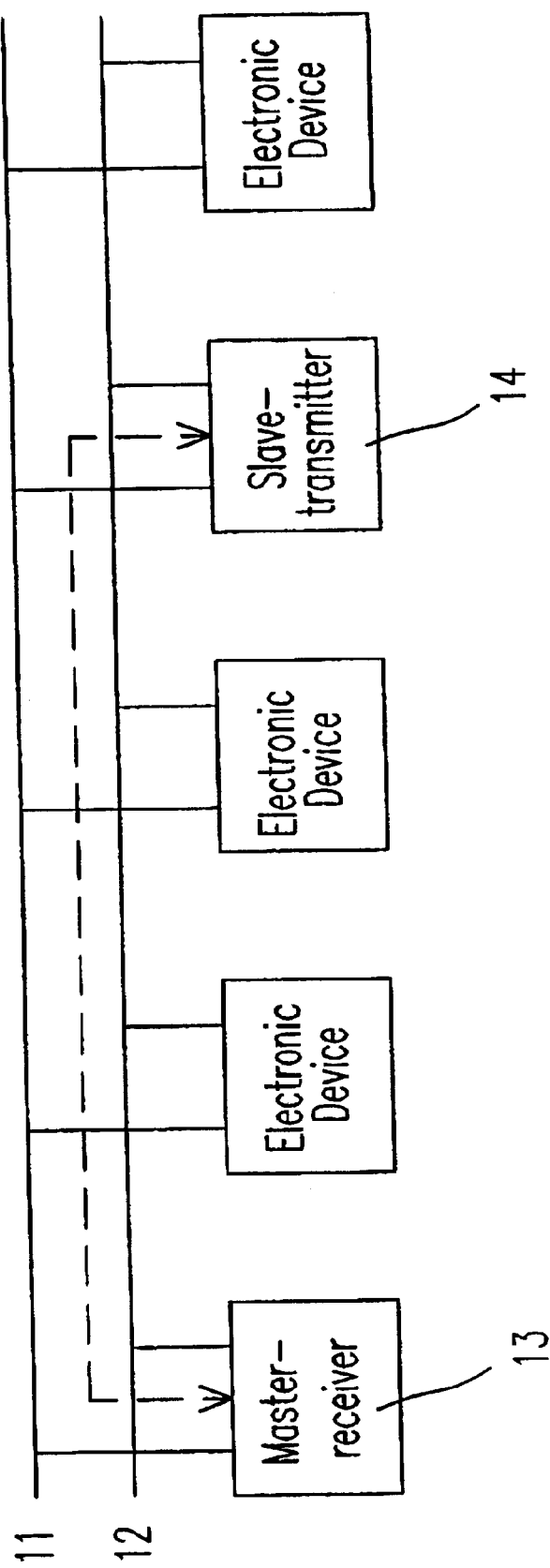
FIG. 1 shows the construction of an I²C bus.
Figure 2:
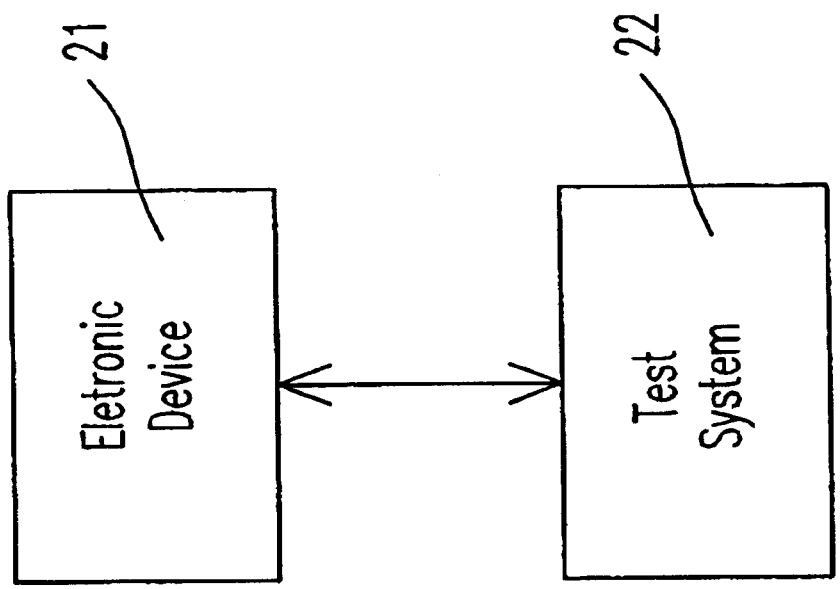
FIG. 2 shows the first conventional test construction for testing an electronic device without an I²C interface.
Figure 3:
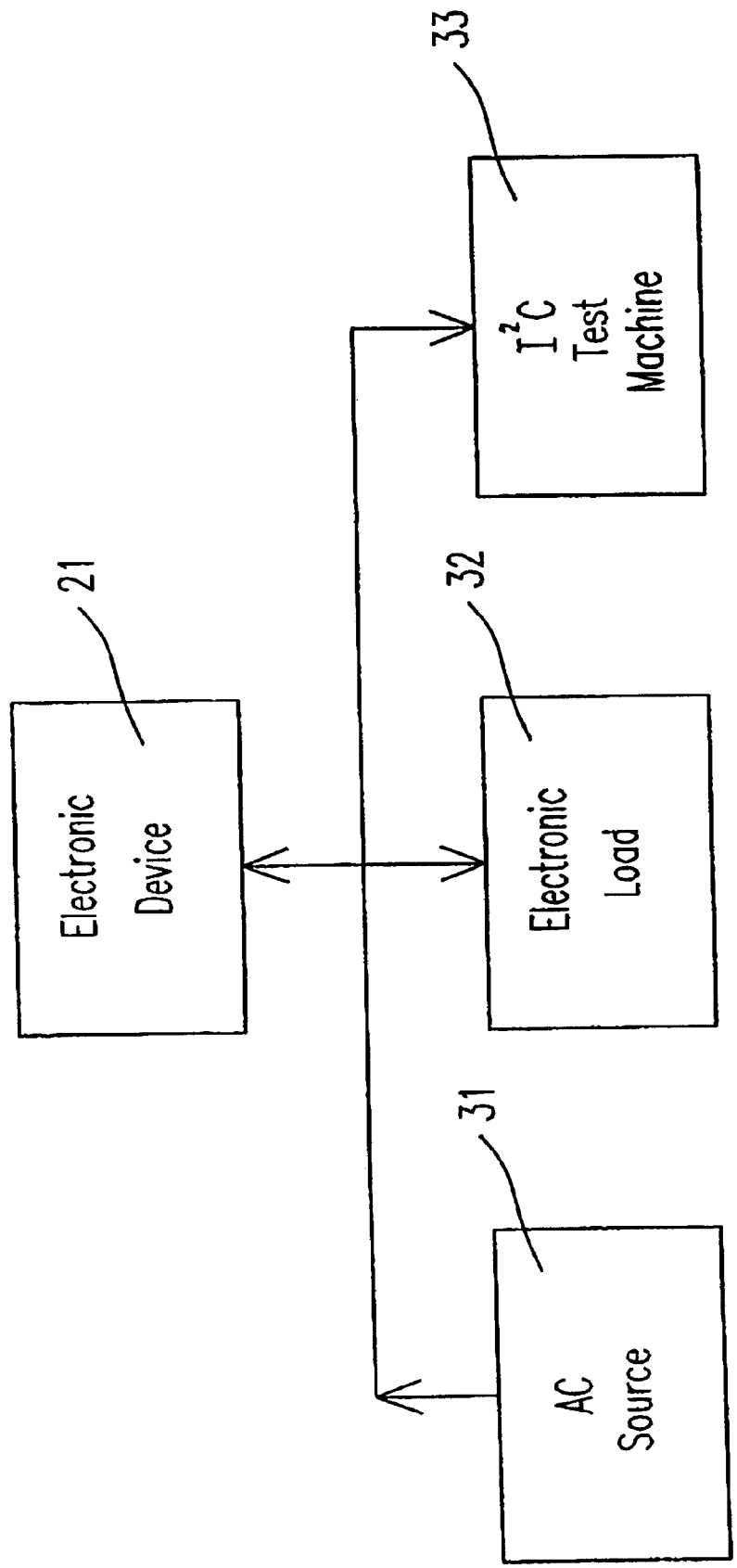
FIG. 3 shows the second conventional test construction for testing an electronic device with an I²C interface.
Figure 4:
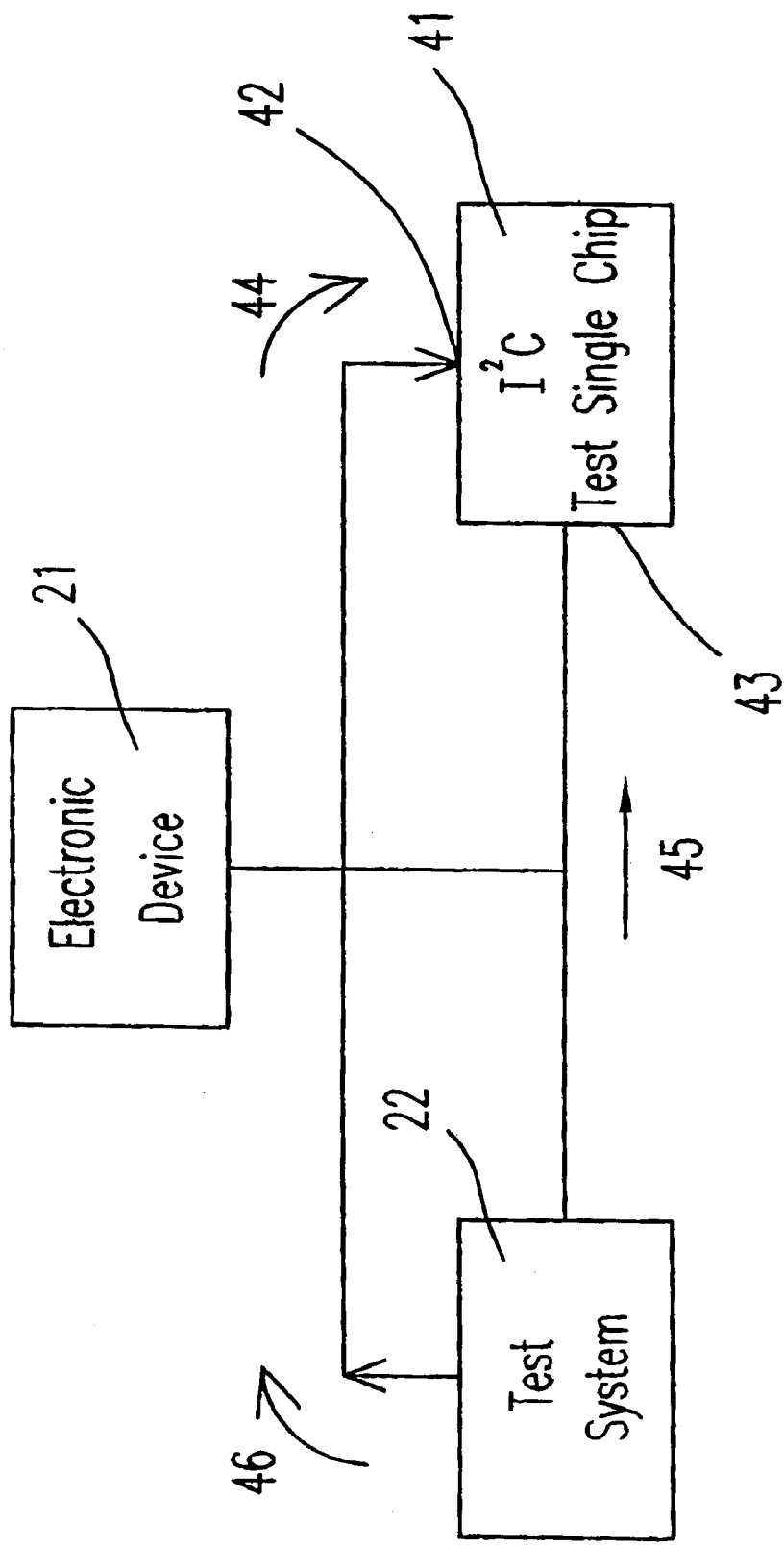
FIG. 4 shows the test construction for testing an electronic device with an I²C interface by the I²C test single chip of the present invention.

Please refer to FIG. 4 showing a preferred embodiment of the test construction of the present invention. The I²C test single chip of the present invention is used for testing an electronic device with an I²C interface, preferably a server power supply with an I²C interface. In comparison with the conventional test construction shown in FIG. 2, the test construction of the present invention further includes an I²C test single chip (41) electrically connected to the electronic device (21) with a first interface (42) and electrically connected to the test system (22) with a second interface (43).

The I²C test single chip (41) not only can be set outside the test system (22) (as shown in FIG. 4), but also can be set inside the test system (22) to be combined with the circuitry of the test system (22). The test construction of the latter is externally like to the test construction in FIG. 2, but the functions of the elements will be different.

Please refer to FIG. 4. When the test system (22) outputs a test signal (46), such as an overload signal or short-circuit signal, to the electronic device (21), the electronic device (21) will output the first signal (44) through the I²C interface of the electronic device (21) to the I²C test single chip (41). On the other hand, while the test system (22) outputs the test signal (46), the test system will also output the second signal (45) to the I²C test single chip (41) to inform the I²C test single chip (41) what kind of test is making. Therefore, the I²C test single chip (41) will receive the first signal (44) from the electronic device (21) through its first interface (42) and receive the second signal (45) from the test system (22) through its second interface (43).

Figure 5:
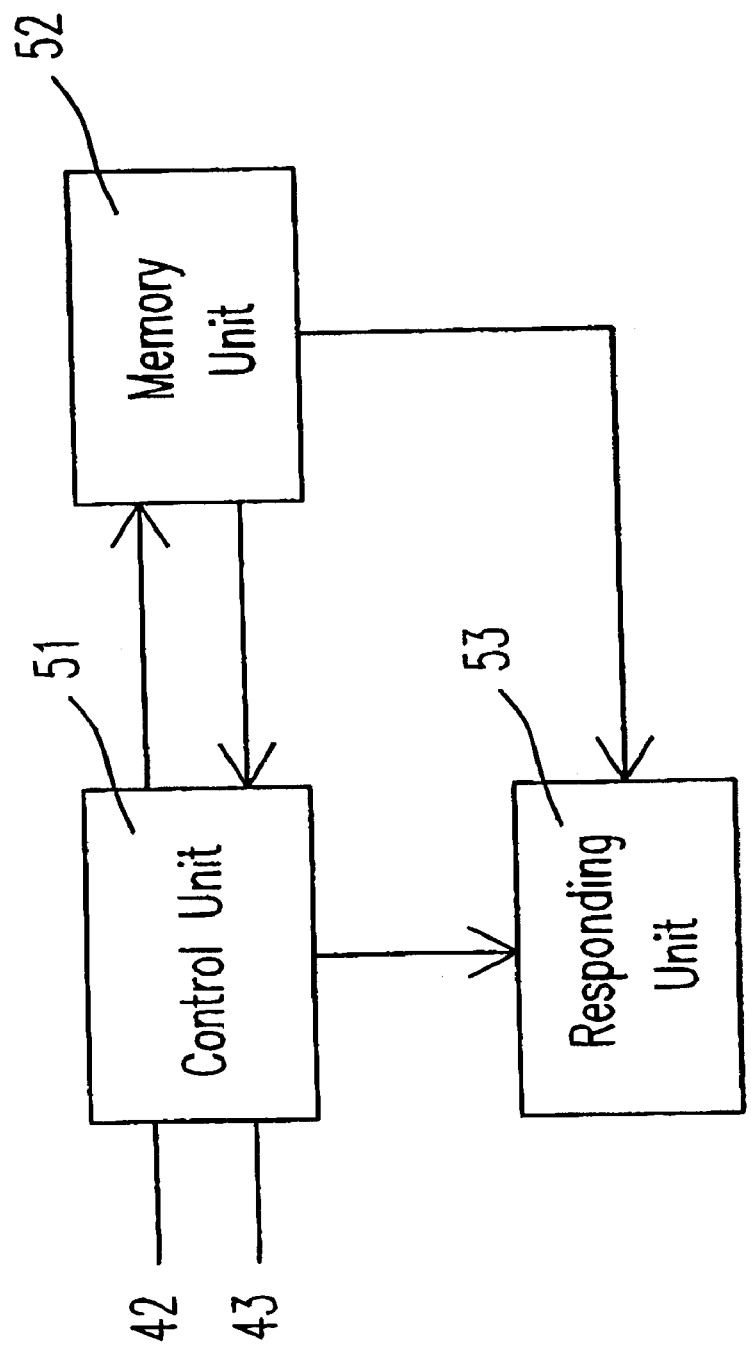
FIG. 5 shows the chip body of the I²C test single chip according to the present invention.

FIG. 5 shows the chip body of the I²C test single chip. The chip body includes a memory unit (52), a control unit (51) and a responding unit (53). The memory unit is used for recording a corresponding rule between a first signal and a second signal when the I²C interface of the electronic device is well-functioned. The control unit is electrically connected to the memory unit for finishing the processing procedure according to the corresponding rule. The responding unit is electrically connected to the control unit for taking a responding procedure after the control unit finishing the processing procedure.

The memory unit (52) of the I²C test single chip (41) is logically a table recording a corresponding rule between the first signal (44) and the second signal (45). After the control unit (51) receives the first and second signals (44, 45), the control unit (51) will compare the received relationship between the first and second signals with the corresponding rule recorded in the memory unit (52) to check whether the received relationship between the first and second signals is correct. Then, the control unit (51) will transmit the checking result to the responding unit (53) and the user can know the checking result from the responding unit (53).

As an example, if the second signal (45) outputted from the test system (22) is an overload signal "01", the first signal (44) outputted from the I²C interface of the server power supply (21) should be a corresponding overload signal "FF" under the normal condition. Therefore, the corresponding rule recorded in the memory unit (52) is a second signal "01" corresponding to a first signal "FF".

As a result, when the test system (22) tests the server power supply (21) in the overload condition, the test system (22) outputs an overload test signal (46) to the server power supply (21) and outputs a second signal (45) to the I²C test single chip (41). In response to the test signal (46), the server power supply (21) will output a first signal (44) to the I²C test single chip (41) through its I²C interface. After the I²C test single chip (41) receives the first signal (44) and the second signal (45), the control unit (51) will compare the received relationship between the first and second signals with the corresponding rule recorded in the memory unit (52) to check whether the received relationship between the first and second signals is correct. If the received relationship between the first and second signals is the same as the corresponding rule recorded in the memory unit (52), i.e. "FF" to "01", it means that the I²C interface of the server power supply (21) passes the overload test. If the received relationship between the first and second signals is different from the corresponding rule, the I²C interface of the server power supply (21) needs to be double-checked.

The memory unit (52) is preferably a read-only-memory (ROM) recording a table of the corresponding rule, and the control unit (51) is preferably a comparator or a microprocessor. Therefore, by changing the memory unit (52), the I²C test single chip can be used for different kinds of electronic devices. The I²C test single chip of the present invention can be used and maintained easily.

The responding unit (53) can be a displaying device, such as a liquid crystal display (LCD) monitor, for displaying the checking result thereon. The responding unit (53) can also be a responding circuitry for sending the checking result back to the test system (22) so as to output the checking result with other test results later.

In conclusion, it is very simple to use and maintain the I²C test single chip of the present invention. In addition, the I²C test single chip can be used for different kinds of electronic devices having an I²C interface with different memory units such that the production process can be conveniently carried out and needs significantly less time, thereby further reducing the production cost.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An I²C test single chip electrically connected to a test-environment-providing system which is used for outputting a test signal to an electronic device having an I²C interface and outputting a second signal to said I²C test single chip simultaneously, comprising:

a first interface electrically connected to said I²C interface of said electronic device for receiving a first signal from said I²C interface of said electronic device in response to said test signal;

a second interface electrically connected to said test-environment-providing system for receiving said second signal; and a chip body for taking a processing procedure to assist said test environment-providing system in testing said I²C interface of said electronic device in response to said first signal and said second signal.

2. The I²C test single chip according to claim 1, wherein said chip body comprises:

a memory unit for recording a corresponding rule between said first signal and said second signal when said I²C interface of said electronic device is functioning correctly;

a control unit electrically connected to said memory unit for finishing said processing procedure according to said corresponding rule; and a responding unit electrically connected to said control unit for taking a responding procedure after said control unit finishes said processing procedure.

3. The I²C test single chip according to claim 2, wherein said control unit is a comparator.

4. The I²C test single chip according to claim 2, wherein said control unit is a microprocessor.

5. The I²C test single chip according to claim 2, wherein said processing procedure is to compare a received relationship between said first and said second signals with said corresponding rule to check whether said received relationship between said first and said second signals is correct and to output a test result to said responding unit.

6. The I²C test single chip according to claim 5, wherein said responding unit is a displaying device.

7. The I²C test single chip according to claim 6, wherein said responding procedure is to display said test result on said displaying device.

8. The I²C test single chip according to claim 6, wherein said displaying device is a liquid crystal display (LCD) monitor.

9. The I²C test single chip according to claim 5, wherein said responding unit is a responding circuitry.

10. The I²C test single chip according to claim 9, wherein said responding procedure is to output said test result to said test-environment-providing system.

11. The I²C test single chip according to claim 2, wherein said memory unit is a read-only-memory (ROM).

12. The I²C test single chip according to claim 1, wherein said electronic device is a server power supply.

13. The I²C test single chip according to claim 1, wherein said first interface is an I²C interface.

14. An I²C test single chip electrically connected to a test-environment-providing system which is used for outputting a test signal to an electronic device having an I²C interface and outputting a second signal to said I²C test single chip simultaneously, comprising:

a first interface electrically connected to said I²C interface of said electronic device for receiving a first signal from said I²C interface of said electronic device in response to said test signal;

a second interface electrically connected to said test-environment-providing system for receiving said second signal; and a chip body for testing said I²C interface of said electronic device by comparing a received relationship between said first signal and said second signal when said I²C interface of said electronic device is functioning correctly to check whether said received relationship between said first and said second signals is correct and then outputting a test result.

15. The I²C test single chip according to claim 14, wherein said electronic device is a server power supply.

16. The I²C test single chip according to claim 14, wherein said corresponding rule is recorded in a memory unit of said I²C test single chip.

17. The I²C test single chip according to claim 14, wherein said test result is outputted by a responding unit of said I²C test single chip.

18. The I²C test single chip according to claim 14, wherein said responding unit is a displaying device.

19. The I²C test single chip according to claim 18, wherein said displaying deice is a liquid crystal display (LCD) monitor.

20. The I²C test single chip according to claim 14, wherein said first interface is an I²C interface.

* * * * *